United States Patent
Guo

(10) Patent No.: US 8,289,066 B2
(45) Date of Patent: Oct. 16, 2012

(54) GATE CONTROL CIRCUIT FOR HIGH BANDWIDTH SWITCH DESIGN

(75) Inventor: Dianbo Guo, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 306 days.

(21) Appl. No.: 12/650,377

(22) Filed: Dec. 30, 2009

(65) Prior Publication Data

US 2011/0156794 A1 Jun. 30, 2011

(51) Int. Cl.
*H03K 17/687* (2006.01)
(52) U.S. Cl. .................. 327/427; 327/419
(58) Field of Classification Search .............. None
See application file for complete search history.

(56) References Cited

U.S. PATENT DOCUMENTS

| | | | | |
|---|---|---|---|---|
| 5,084,634 A * | 1/1992 | Gorecki | | 327/91 |
| 6,462,611 B2 * | 10/2002 | Shigehara et al. | | 327/534 |
| 7,129,766 B2 * | 10/2006 | Steinhagen | | 327/427 |
| 7,667,525 B2 * | 2/2010 | Grimone, III | | 327/427 |
| 8,004,340 B2 * | 8/2011 | Guo et al. | | 327/333 |
| 8,054,122 B2 * | 11/2011 | Guo | | 327/333 |
| 2002/0075060 A1 * | 6/2002 | Goodell et al. | | 327/427 |
| 2003/0016072 A1 * | 1/2003 | Ramakrishnan | | 327/434 |
| 2005/0275448 A1 * | 12/2005 | Alacoque et al. | | 327/427 |

* cited by examiner

*Primary Examiner* — Cassandra Cox
(74) *Attorney, Agent, or Firm* — Seed IP Law Group PLLC

(57) ABSTRACT

An analog switch configuration includes a gate control circuit coupled between an input of a switch and a gate of the switch. The gate control circuit passes voltage changes on the input of the switch to the gate of the switch to decrease the influence the inherent gate to input capacitance has on the bandwidth of the switch. By reducing the change in voltage across the inherent capacitance, the current through the capacitance in decreased as well as its influence on the bandwidth of the configuration.

14 Claims, 9 Drawing Sheets

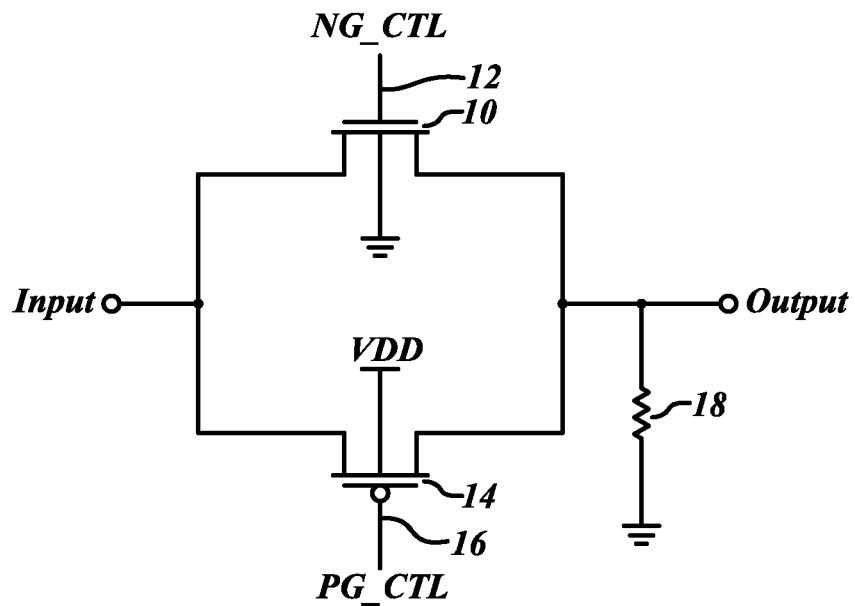
FIG.1A *(Prior Art)*
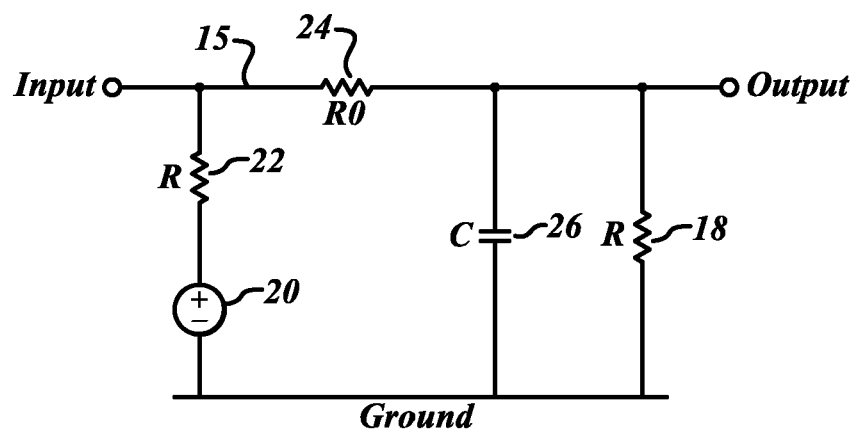
FIG.1B *(Prior Art)*

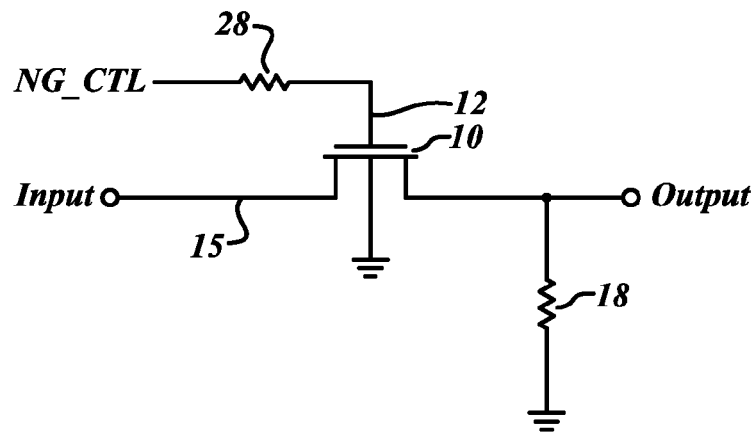
FIG.2A *(Prior Art)*
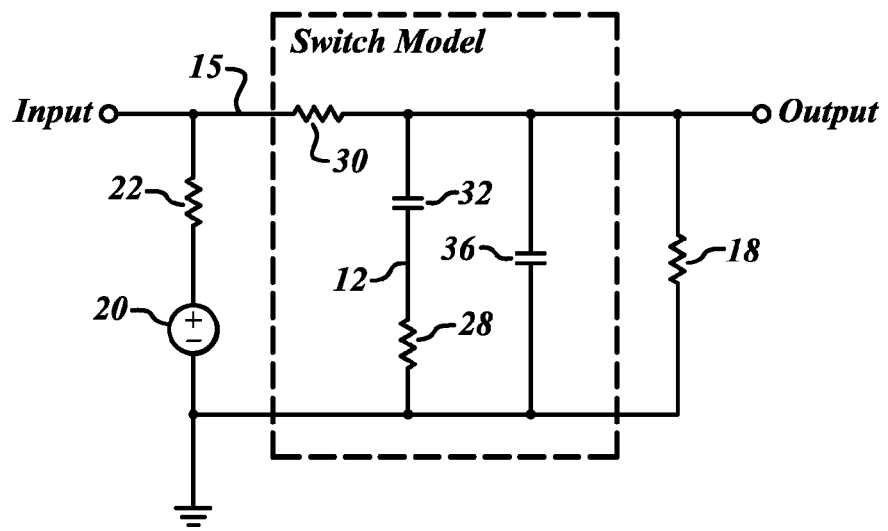
FIG.2B *(Prior Art)*
| R1 (Ω) | 0 | 1 | 10 | 100 | 1000 |
|---|---|---|---|---|---|
| Bandwidth (Mhz) | 607 | 600 | 560 | 750 | 1180 |
FIG.2C *(Prior Art)*

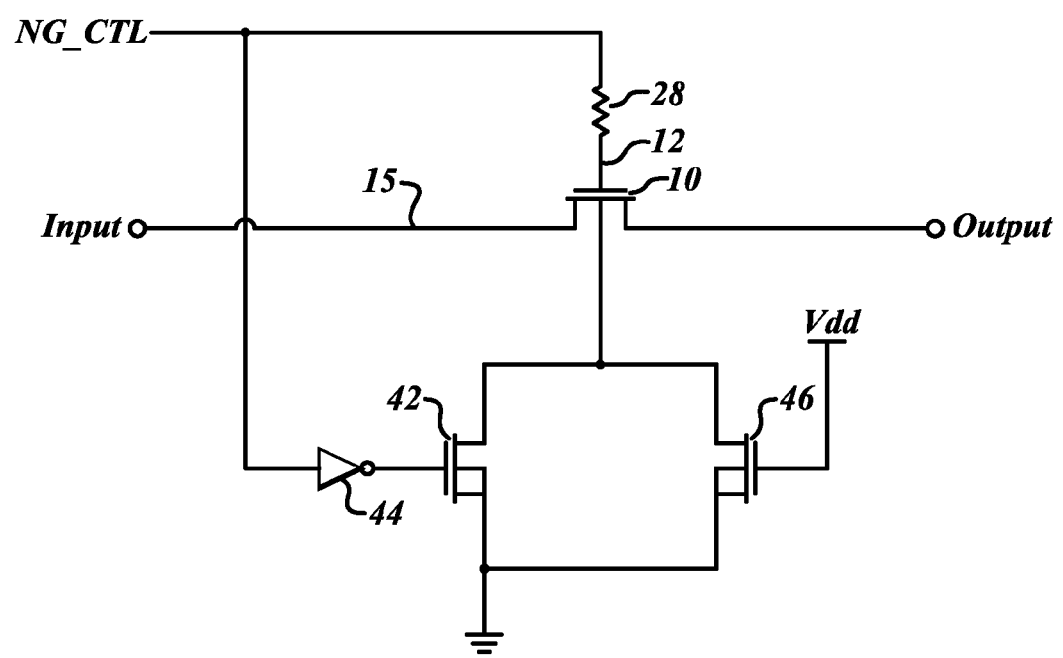
FIG. 3C *(Prior Art)*

GATE CONTROL CIRCUIT FOR HIGH BANDWIDTH SWITCH DESIGN

BACKGROUND

1. Technical Field

This disclosure generally relates to the field of analog switching.

2. Description of the Related Art

Switches play an important role in the design of circuits. Generally a switch is used to pass a signal from an input terminal of the switch to the output terminal of the switch. This use of a switch generally has two states. The first state corresponds to when the switch is passing a signal, and the second state corresponds to when the switch is not passing a signal.

FIG. 1A shows an example of a switch configuration. In this example, the switch configuration is that of a transmission gate. The transmission gate of FIG. 1A comprises complementary transistors coupled in parallel to each other. In this example, switch 10 is an n-channel metal-oxide semiconductor ("NMOS") transistor. Switch 14 is a p-channel metal-oxide semiconductor ("PMOS") transistor. As shown in FIG. 1A, the sources of the transistors are coupled together as an input terminal, and the drains of the transistors are coupled together as an output terminal. The control terminals, or gates, of the transistors are coupled to respective control signals. A load resistor 18 represents a resistance that may coupled to a typical output of a switch configuration such as that found in FIG. 1A.

The transmission gate of FIG. 1A is a beneficial configuration of a switch because the combination of the switch 10 and switch 14 allows for a full swing of the input signal to be represented on the output. The switch 10 fully passes voltage signals ranging down to or near a low voltage rail, and switch 14 fully passes voltage signals ranging up to or near a high voltage rail.

FIG. 1B represents a small signal model of the circuit in FIG. 1A. A voltage source 20 is coupled to the input of the transmission gate and is applying a voltage through a voltage source resistance 22. Channel resistance 24 represents the channel resistance of switch 10 in parallel with switch 14. The output capacitance 26 represents the output capacitance of switch 10 in parallel with the output capacitance of switch 14, and load resistance 18 of FIG. 1B represents load resistor 18 shown in FIG. 1A.

Looking at both FIG. 1A and FIG. 1B, consider the state where control signal NG_CTL is high and its complimentary control signal PG_CTL is low, so that switch 10 and switch 14 are fully on. With channel resistance 24 of FIG. B representing an on-resistance for the switches, the bandwidth of the switch configuration can be estimated. The voltage source resistance 22 is approximately equal to the load resistance 18, each having a value R. With the channel resistance 24 having a value of R0 and output capacitance 26 having a value of C, a time constant τ can be calculated as follows: τ=((R+R0)∥R) C. Neglecting the comparatively channel resistance 24, R0, results in an equivalent resistance of approximately $$\frac{R}{2}.$$

Thus the approximate time constant of the single time constant circuit is $$\tau = \frac{RC}{2}.$$

Because bandwidth can be estimated as being approximately $$\frac{1}{\tau},$$

the bandwidth of this circuit is approximately $$\frac{2}{RC}.$$

It should be noted that the bandwidth of this single time constant low-pass filter circuit is inversely proportional to the resistance and the capacitance of the circuit. The capacitor C affects the circuit output when current begins flowing through the capacitor to ground. Thus, the ability to mitigate the affect of the capacitor by reducing current flowing through it will result in increasing the bandwidth of the circuit.

Conventionally, to increase the bandwidth of an analog switch, a series resistor is inserted between the gate of the transistor and some gate control circuit. FIG. 2A shows a single-transistor configuration of a switch and includes switch 10, control terminal resistor 28, and load resistor 18. In order to achieve high bandwidth, either an NMOS or PMOS transistor is used as a switch, instead of a complimentary pair. The selection of the device will depend upon the input signal range to be used in the design. However, NMOS carriers are smaller and are more mobile than their PMOS counterparts, so NMOS transistors are considered more frequently than PMOS transistors for implementation in high frequency switches.

FIG. 2B represents a small signal model of the circuit in FIG. 2A. FIG. 2B includes voltage source 20, a voltage source resistance 22, load resistor 18, and a switch model inclusive of control terminal resistor 28. The switch model comprises channel resistance 30, oxide capacitance 32, control terminal resistor 28, and capacitance 36. The effect of the control terminal resistor 28 can be seen when an AC signal is forced into the input of the switch. Current passing through a capacitor increases with increase in frequency as $$\left(\frac{1}{j\omega C}\right)$$

and effectively acts as a short in high frequencies. However, rather than the capacitance 32 shorting to AC ground, the current is directed through control terminal resistor 28, thereby producing a voltage drop across the resistor. This voltage drop effectively maintains a voltage on control terminal 12 of switch 10, allowing the transistor to continue operating until other parasitic effects attenuate the signal. FIG. 2C charts the bandwidth of a design of switch 10 against various values of control terminal resistor 28. As is shown, a conventional configuration for increasing bandwidth in an analog switch is performed by placing a resistor in series with the control terminal of the switch.

Other configurations used to increase the bandwidth of a switch include the use of additional transistors to control the bulk of the device. FIGS. 3A, 3B, and 3C represent different configurations of bulk control circuits used to increase the bandwidth of a switch. In these configurations, the main purpose is to reduce the parasitic capacitance seen from the source to the body and seen from the drain to the body of switch 10.

FIG. 3A includes switch 10, control terminal resistor 28 and bulk transistors 38, 40, and 42. While control signal NG_CTL holds switch 10 on, bulk transistors 38 and 40 provide a low resistance connection to between input terminal 15 to bulk and between the output terminal to bulk, respectively. This configuration of a switch can be used in parallel with other similar versions of the switch. When switch 10 is off bulk transistor 42 provides a low resistance connection between the body of switch 10 and ground. Said connection allows other switch configurations coupled in parallel to use switch 10 as capacitive loading.

FIG. 3B includes switch 10, control terminal resistor 28 and bulk transistors 42 and 44. In this configuration, the resistance from bulk to ground can be set at different values for different transistor states. For example, by setting the on-resistances of bulk transistors 42 and 44 to be different from one another, switch 10 may be configured with different bulk to ground resistances. Switch 10 may configured with one bulk to ground resistance through bulk transistor 44 when switch 10 is on, and it may be configured with another bulk to ground resistance through bulk transistor 42 when switch 10 is off. These defined channel resistances reduce the parasitic capacitances seen from the input and output terminals to bulk.

FIG. 3C is a variation of the switch configuration of FIG. 3B. FIG. 3C shows bulk transistor 46 tied to rail voltage VCC. This bulk circuit configuration allows current flowing through the input and output terminal capacitances of switch 10 to flow through the channel resistance of bulk transistor 46 before passing to ground. While switch 10 is held off, i.e., control signal NG_CTL is low, the bulk resistance is decreased by holding bulk transistor 42 on in parallel with bulk transistor 46, thereby increasing the capacitive loading of devices sharing a common output with switch 10.

In summary, there are several configurations that have attempted in the past or conventionally to increase the bandwidth of an analog switch. However, each of these configurations have particular shortcomings which they do not overcome.

BRIEF SUMMARY

In one embodiment, an analog switch, having an input terminal, output terminal and control terminal, is coupled to a control signal through a gate control circuit. The control signal can hold the switch off or on. While the control signal holds the switch off, the features of the present disclosure are not provided. Accordingly, during most operating conditions the control signal holds the switch on. While the control signal holds the switch on, a first transistor coupled between a rail voltage and the control terminal of the switch supplies current into a node including the control terminal of the switch. A second transistor in series with a resistor is also held on. The second transistor couples the control terminal of the switch to its input terminal. At high frequency, the capacitance from the control terminal to the input terminal is in parallel with the combined resistance of the second transistor in series with the resistor. Having a resistance in parallel with the control terminal to input terminal capacitance reduces the affect of the capacitance in reducing signal bandwidth.

In another embodiment, a current source is coupled between a voltage rail and the node including the control terminal. The current source can be implemented with a band gap, current mirror, or other current source design. Having a current source supply current to the node including the control terminal of the switch provides for a more stable current value supplied to the node over a single transistor. A more stable current at the node results in a more consistent voltage drop across the control terminal to input terminal of the switch. The more constant the voltage is across the control terminal to the input terminal, the less affect the control terminal to input terminal capacitance will have on the bandwidth of the switch.

In another embodiment, the second transistor in series with the resistor are coupled between the control terminal and input terminal of the switch in a source follower configuration. The incorporation of a source follower between these terminals enables voltage changes on the input terminal to be translated to the control terminal without supplying current into the input terminal. Supplying current into the input terminal decreases the quality of the input signal by increasing or decreasing the amplitude of the signal.

Capacitances that inherently exist in the construction of a switch cannot always be reduced, but their effect can be mitigated in accordance with embodiments of the present invention. Features of the present disclosure provide a way of increasing bandwidth by inserting gate control circuitry in parallel with the capacitance between the control terminal and input terminal of the switch. Because capacitor current is a function of change in voltage across the capacitor, the capacitor current can be reduced by reducing the change in voltage across the capacitor. That is, $$i_C = C\frac{dv}{dt};$$

therefore, minimizing dv will minimize the current flowing through the capacitor and in turn will minimize the affect the capacitor has on the circuit.

High frequency switches, such as those presently disclosed, have many applications. For example, high definition multimedia interface ("HDMI"), a standard that is common in high-definition televisions, uses drivers that may incorporate a high frequency analog switch such as is presently disclosed. In such an application, a switch may be used to select one of multiple inputs available on a particular port. An analog switch can also be used as on an output. In such use, a switch may be coupled to the output of an output buffer, so as to enable a design to selectively connect particular buffers with a particular output port. Another example of an application using analog switches includes low-voltage differential signaling ("LVDS"), a high speed differential signaling system. LVDS sends opposing current signals down a pair of wires which are terminated in a resistive load to produce a voltage. Analog switches enable the use of these high speed applications, the applications being prevalent in technologies spanning from computers to television monitors.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. Further, some figures are in schematic form and the particular shapes of some of the elements as drawn are not intended to convey information regarding the actual shape of the particular elements and have been selected for ease of recognition in the drawings.

FIGS. 1A and 1B illustrate a transmission gate and the small signal equivalent of the transmission gate.

FIGS. 2A, 2B, and 2C illustrate an analog switch pass gate with a resistor in the control terminal. Also illustrated are the small signal model of the relevant circuit and a bandwidth diagram of the output of the circuit.

FIGS. 3A, 3B, and 3C illustrate bulk control circuits conventionally used to increase the bandwidth of an analog switch.

DETAILED DESCRIPTION

Figure 3A:
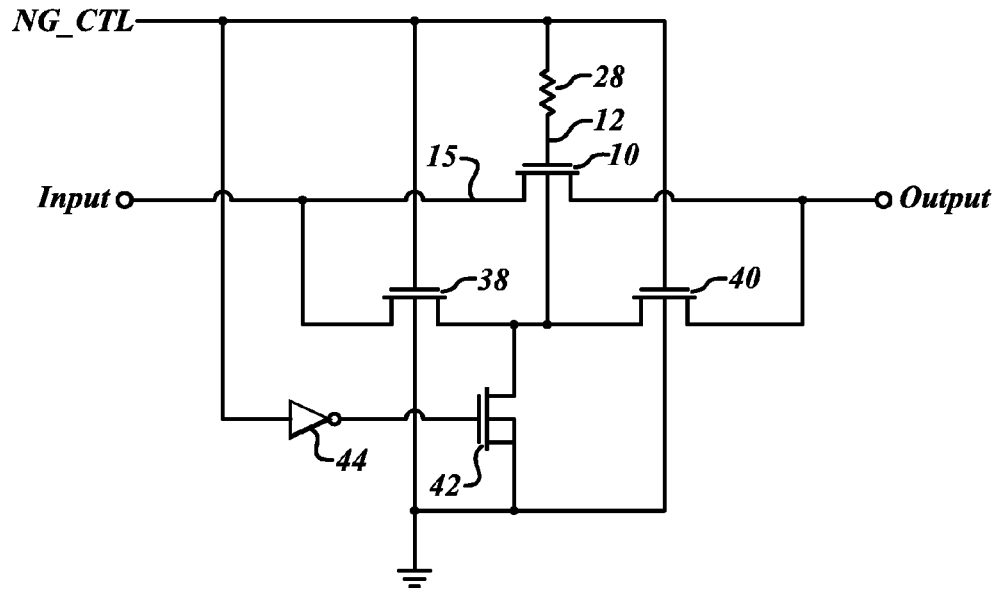
Figure 3B:
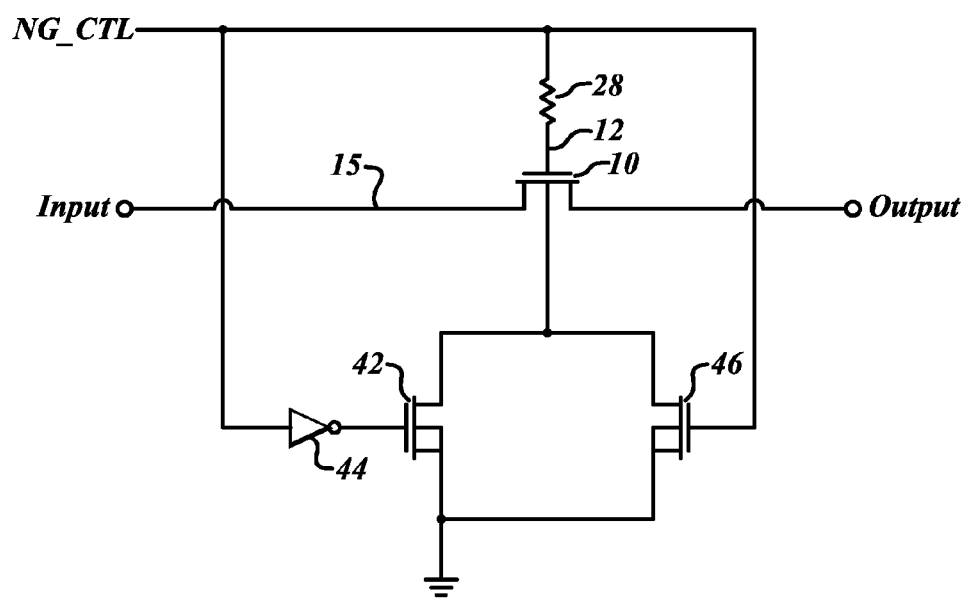
Figure 4A:
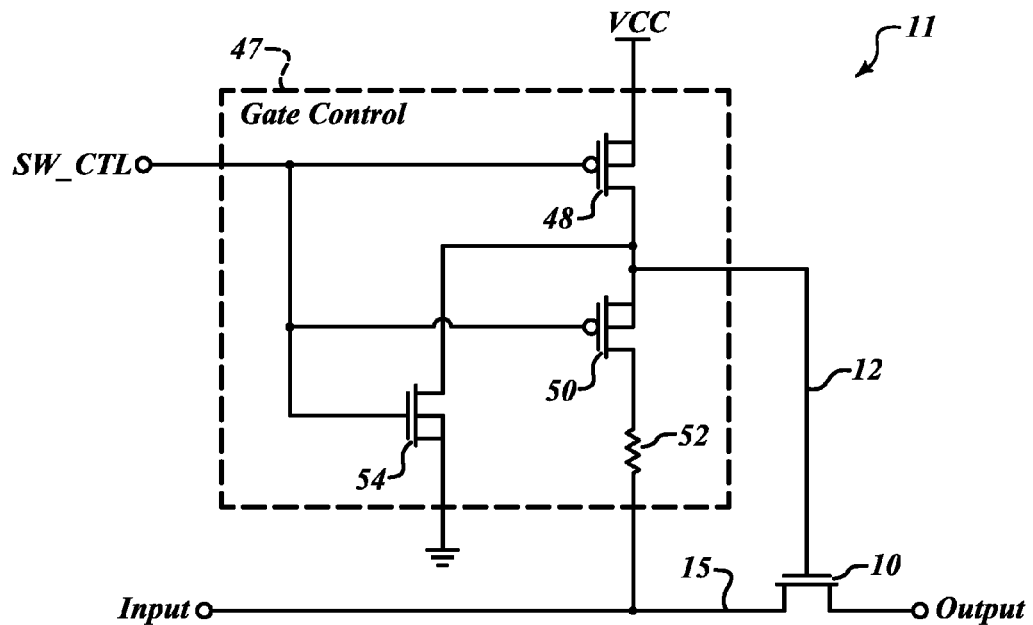
FIGS. 4A, 4B, and 4C illustrate a gate control circuit for an analog switch to improve the bandwidth of a switch, in accordance with an embodiment of the invention.

FIG. 4A shows an analog switch configuration 11, in accordance with an embodiment of the invention. The configuration includes a switch 10 having an input terminal 15, an output terminal, and a control terminal 12. Switch configuration 11 also includes transistor 48 coupled between upper voltage rail VCC and control terminal 12, transistor 50 coupled between control terminal 12 and resistor 52, and resistor 52 coupled between transistor 50 and input terminal 15. Transistor 54 is coupled between control terminal 12 and ground. Transistors 48, 50, and 54 and resistor 52 comprise the gate control circuit 47. The gates of the transistors 48, 50, and 54 are coupled to a control signal SW_CTL, which controls the on/off operation of switch 10.

The present disclosure relates to a gate control circuit of an analog switch. Analog switches are widely used in basic circuit components. The switches can provide a great deal of flexibility at the system level and facilitate high bandwidth designs. High bandwidth switches are especially useful in high-speed applications such as universal serial bus ("USB"), local area networks ("LANs"), DisplayPort, and the like.

In order to achieve high bandwidth, either an n-channel metal-oxide-semiconductor ("NMOS") transistor or a p-channel metal-oxide-semiconductor ("PMOS") transistor is used as a switch, instead of using a complementary NMOS and PMOS pair. The type of transistor selected, NMOS or PMOS, is dependent upon the input signal range. With a defined on-resistance for the switch, the conventional way of increasing bandwidth is to place a resistor in series between the control terminal, or gate, of the switch and the gate control circuit. In contrast to convention, the present disclosure relates to a gate control circuit coupling the input terminal to the control terminal of a switch to increase the bandwidth of the switch.

In one embodiment, the configuration of switch 10 is that of a pass gate. While a complementary pair of n-channel metal-oxide semiconductor ("NMOS") and p-channel metal-oxide semiconductor ("PMOS") transistors configured as a transmission gate (FIG. 1A) may better transmit a high and low range of voltages from input terminal 15 to the output terminal, a single transistor in a pass gate configuration will operate more quickly. Furthermore, in a single transistor pass gate configuration, an NMOS transistor is generally more desirable than a PMOS transistor when the sought characteristic of the circuit is speed because NMOS transistors operate faster for the same size of device. In one embodiment, switch 10 is an NMOS transistor. In another embodiment, switch 10 is a PMOS transistor.

Switch 10 has capacitive and resistive characteristics inherent in its construction. Typically, transistor designers try to make the capacitances and channel resistance as small as possible. However, switch 10 has, while operated in the triode region, a channel resistance. The channel resistance is typically small, ranging from a few ohms to typically tens of ohms.

An NMOS transistor configured to operate in a triode region will have several parasitic capacitances. Parasitic capacitances act to slow down or attenuate the transmission of high frequency signals from the input terminal to the output terminal. The interface between the control terminal, or gate, and the channel (inverted) will have an oxide capacitance, Cox. The oxide capacitance Cox is typically modeled as being split in half. One half of Cox is typically modeled as existing between the control terminal and the input terminal. The other half of Cox is typically modeled as existing between the control terminal and the output terminal. Switch 10 also has parasitic capacitances associated with the junction between input terminal 15 and its body, otherwise known as the bulk, and capacitances associated with the junction between the output terminal and the body.

At high frequencies, the capacitance between the control terminal and input terminal 15 begins acting like a conductor, or a short. This behavior is modeled by the equation $$Z_C = \frac{1}{j\omega C},$$

which shows that as the frequency increases the impedance of the capacitor becomes smaller. At high frequencies, which value depends on the size of capacitor, the capacitance acts as the equivalent of an AC signal short to effectively reduce the voltage between the control terminal and input terminal 15 to zero. Because the AC current flowing through the channel of switch 10, id=gm~vgs, is proportional to the voltage between the control terminal and input terminal 15, the AC current flowing through the channel of switch 10 is subsequently reduced to zero as well.

The frequency at which the input signal is reduced by a factor of √2 at the output is labeled the 3 db frequency, or the cutoff frequency. The 3 db or cutoff frequency of a switch is a standard for measuring the bandwidth of a switch or circuit. The mitigation of the control terminal to input terminal capacitance will be discussed in conjunction with FIG. 4B. Other proposed designs by the same inventor and common owner herewith are described in application Ser. No. 12/633,777 incorporated herein by reference.

Transistor 48 supplies current into the node of control terminal 12. In one embodiment, transistor 48 is a PMOS transistor. The gate of transistor 48 is coupled to control signal SW_CTL and transistor 48 is off while control signal SW_CTL is high. While control signal SW_CTL is low, the device is on. While on, transistor 48 will source a current into the node of control terminal 12 in accordance with the voltage drop across the source to drain of the device. The greater the voltage drop across the source to drain of transistor 48, the more current it will source. In another embodiment transistor 48 is an NMOS transistor with a source coupled to ground rather than to VCC.

Transistor 50 in series with resistor 52 is configured to selectively provide a finite resistance in parallel to the capacitance between the control and input terminals of switch 10. The gate of transistor 50 is coupled to control signal SW_CTL and the device is on when control signal SW_CTL is low. While transistor 50 is on, current flows through transistor 48, transistor 50, and resistor 52 into input terminal 15. This configuration transmits voltage changes occurring on input terminal 15 onto the control terminal 12.

Transistor 54 is coupled between control terminal 12 and ground. While control signal SW_CTL is low, transistor 54 is off and control terminal 12 can be non-zero. However, while control signal SW_CTL is high, transistor 54 is held on and control terminal 12 is held to ground and switch 10 is held off.

Figure 4B:
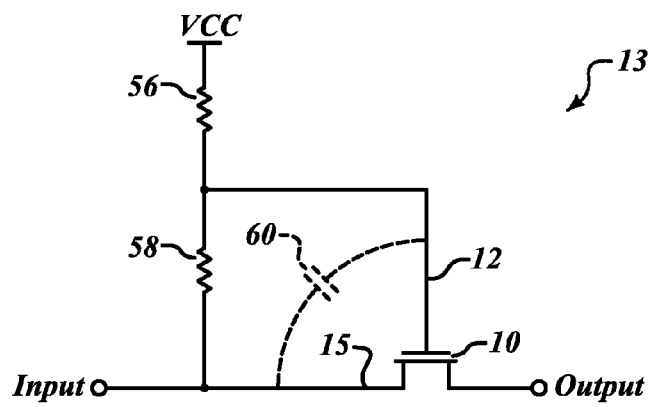

FIG. 4B illustrates a simplified model 13 of analog switch configuration 11 while control signal SW_CTL is low. While control signal SW_CTL is low, transistor 48 is on, transistor 50 is on, transistor 54 is off, and switch 10 is on. Resistor 56 represents the on-resistance of transistor 48. Resistor 58 represents the sum of the on-resistance of transistor 50 and the resistance of resistor 52. While transistor 54 is off, the resistance between its drain and source is considerably high, therefore the resistance of transistor 54 is omitted from FIG. 4B.

Resistors 56 and 58 form a voltage divider between voltage rail VCC and the voltage at input terminal 15. The divided voltage appears at control terminal 12. Because the on-resistances of transistors 48 and 50 are likely to be much smaller than the resistance of resistor 52, the output of the voltage divider will likely be near the voltage rail VCC. However, a purpose of this divider is to transmit AC voltage changes occurring on input terminal 15 onto the control terminal 12 to minimize the AC change in voltage across the control terminal to input terminal capacitance of switch 10.

Simplified model 13 shows an increased bandwidth of switch 10 by modeling a circuit that reduces the change in voltage across the control terminal to input terminal capacitance 60 ("capacitance 60"). As discussed previously, capacitors act like short circuits at high frequencies. However, because current through a capacitor is governed by the equation $$i_C = C\frac{dv}{dt},$$

a reduction of the change in voltage across capacitance 60 over time, dv, will reduce the current and the shorting affect of capacitor 60. Of course the absolute voltage on control terminal 12 will be different from the absolute voltage on input terminal 15 by virtue of the voltage drop across resistance 58. However, transmitting input terminal voltage changes to the control terminal 12 preserves the voltage drop between the control and input terminals thereby enabling rapid transitions on input terminal 15 to pass to the output terminal.

Figure 4C:
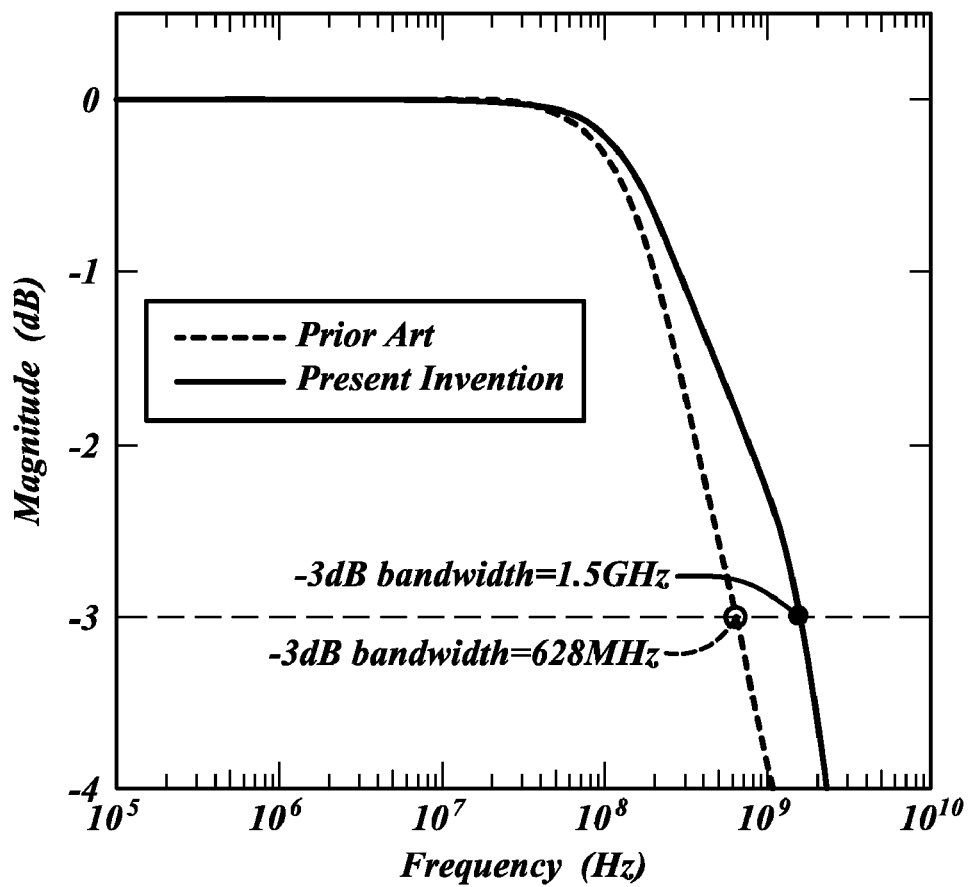

FIG. 4C illustrates a frequency response of analog switch configuration 11, in accordance with an embodiment of the invention. The frequency response shows the response of analog switch configuration 11 along with a response of a conventional analog switch, as described in the prior art. To simplify comparison, the response of both circuits is show from a reference of 0 dB. As shown in FIG. 4C, the bandwidth, or −3 dB frequency, of analog switch configuration 11 is much higher than that of the prior art.

Figure 5A:
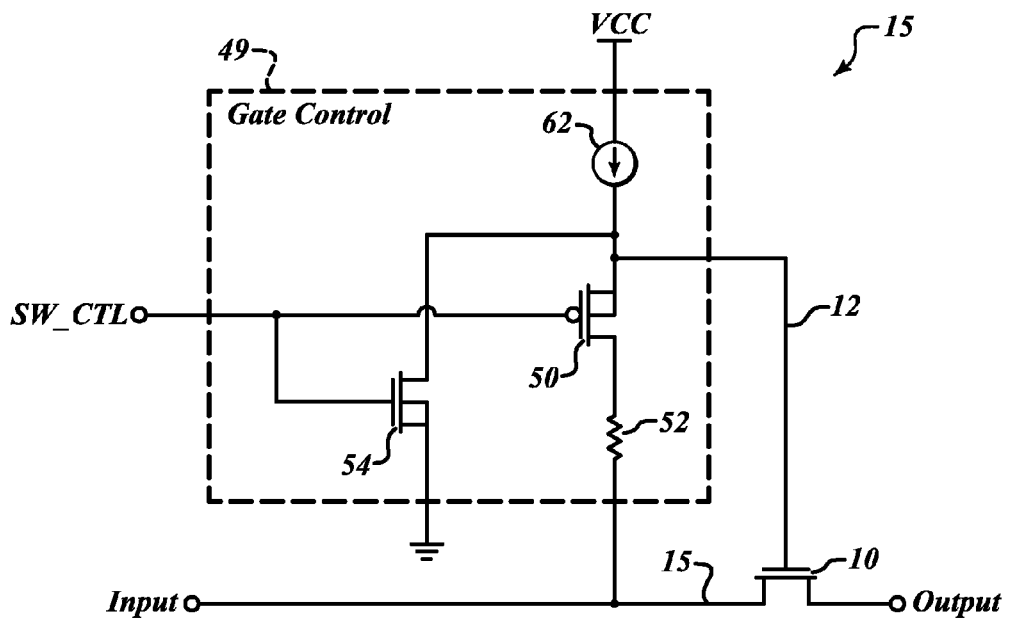
FIGS. 5A, 5B, and 5C illustrate a gate control circuit of an analog switch to improve the bandwidth of the analog switch, in accordance with an embodiment of the invention.

FIG. 5A illustrates an analog switch configuration 15, in accordance with an embodiment of the invention. Analog switch configuration 15 is similar to analog switch configuration 11, with the exception that current source 62 supplies current into gate control circuit 49. Current source 62 is coupled between voltage supply VCC and control terminal 12 to supply a near constant current into the node of control terminal 12.

Analog switch configuration 15 is advantageous over analog switch configuration 11 in that the current supplied is less susceptible to voltage variations on the node of control terminal 12. Furthermore, switch configuration 15 more closely reflects input terminal voltage changes onto control terminal 12. Transistor 48 operating in the triode region will have a drain current that may vary widely as the drain voltage increases and decreases. Current source 62, however, will provide a more stable current through transistor 50 and resistor 52 so as to more accurately reproduce input terminal voltage changes on control terminal 12.

Figure 5B:
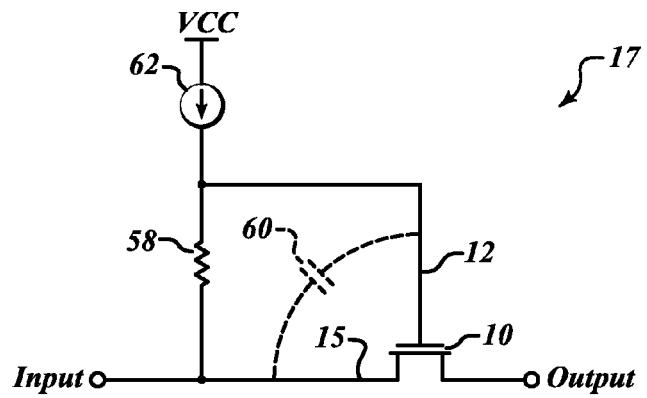

FIG. 5B illustrates a simplified model 17 of analog switch configuration 15. FIG. 5B represents gate control circuitry 49 while control signal SW_CTL is low. While control signal SW_CTL is low, transistor 50 is on. Resistor 58 represents the sum of the on-resistance of transistor 50 and the resistance of resistor 52. With control signal SW_CTL low, transistor 54 is off. While transistor 54 is off, the resistance between its drain and source is considerably high, therefore a representation of that resistance is omitted from FIG. 5B. Current source 62 supplies current into control terminal 12 and nearly fixes the voltage across the control and input terminals of switch 10 to a voltage commensurate with the value of current source 62 multiplied by the value of resistor 58. Fixing the control terminal to input terminal voltage of switch 10 has the effect of nullifying, or at least minimizing the effect of capacitance 60 by reducing the change in voltage across capacitor 60 with respect to time.

Nullification of the effect of capacitance 60 can be more easily understood by evaluating simplified model 17 with exemplary numerical values. For example, if current source 62 were constructed to source 30 mA and resistor 58 were 105 ohms, then the voltage drop across resistor 58 would equal 3.15 V. With a 3.15 V drop across resistor 58 and an input terminal voltage of 0 V, the voltage drop across the control and input terminals of switch 10 would be 3.15. If the signal on input terminal 15 increased to 1 V or decreased to −1 V, the voltage drop across the terminals would remain fixed at 3.15 V. The change in voltage across capacitance 60 would be approximately 0 V because the voltage potential on control terminal 12 would track the changes on input terminal 15. Since the current through capacitance 60 is $$i_C = C\frac{dv}{dt},$$

decreasing the change in voltage across the capacitor to nearly zero will reduce the current flowing through the capacitor to nearly zero as well. In one embodiment, analog switch configuration 15 is operated so that the input signal is less than or equal to the voltage rail VCC minus the voltage drop across resistor 58. In sum, transmitting voltage changes occurring on input terminal 15 to control terminal 12 preserves the voltage drop between the control and input terminals and enables rapid transitions on input terminal 15 to pass to the output terminal.

Figure 5C:
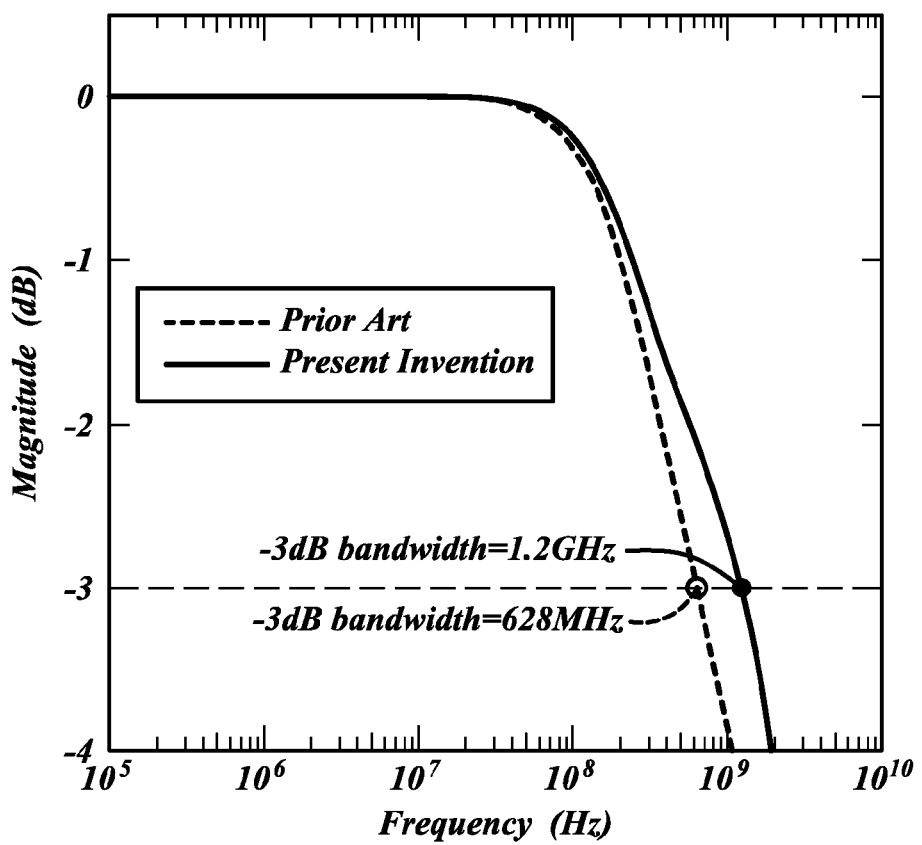

FIG. 5C illustrates a frequency response of analog switch configuration 15, in accordance with an embodiment of the invention. The frequency response shows the response of analog switch configuration 15 along with a response of a conventional analog switch, as described in the prior art. To simplify comparison, the response of both circuits is show from a reference of 0 dB. As shown in FIG. 5C, the bandwidth, or −3 dB frequency, of analog switch configuration 15 is much higher than that of the prior art.

Figure 6A:
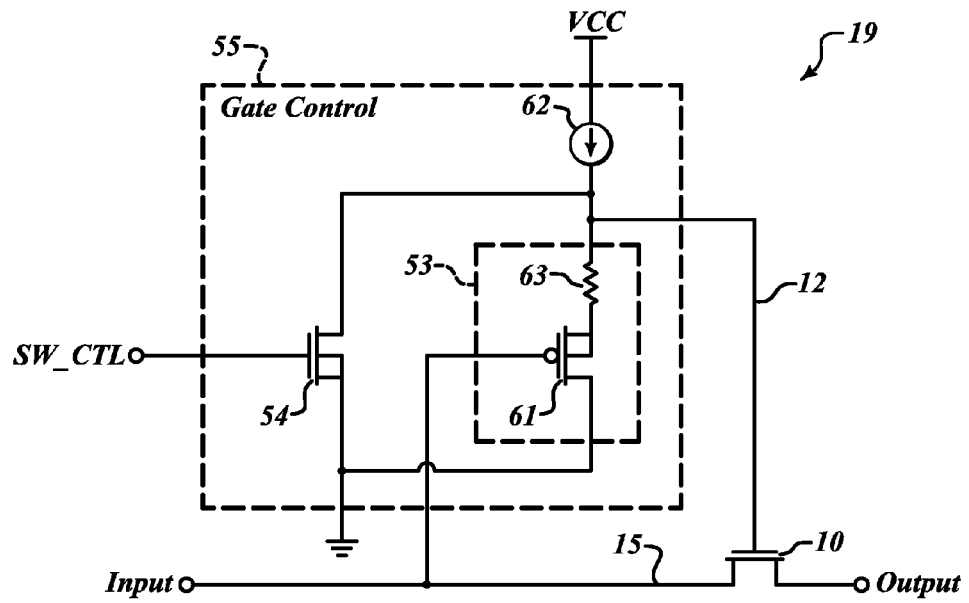
FIGS. 6A and 6B illustrate a gate control circuit of an analog switch to improve the bandwidth of the analog switch, in accordance with an embodiment of the invention.

FIG. 6A shows an analog switch configuration 19, in accordance with an embodiment of the invention. Analog switch configuration 19 includes analog switch 10 having an input terminal, an output terminal and a control terminal 12. The configuration also includes gate control circuit 55 having current source 62, resistor 63 in series with transistor 561, and transistor 54. Gate control circuit 55 is coupled between control signal SW_CTL and control terminal 12 to enable and disable switch 10 and to mitigate the control terminal to input terminal capacitance.

As can be seen in FIG. 6A, current source 62 is coupled between voltage rail VCC and control terminal 12 to supply a substantially fixed current to gate control circuit 55. In one embodiment, current source 62 can be disabled. While control signal SW_CTL is low, neither control terminal 12 nor transistor 54 will sink much current. The current is supplied to bias source follower 53, a common drain amplifier.

The configuration of resistor 63 and transistor 61 constitute source follower 53. Source follower 53 serves at least two purposes. First, it facilitates transmission of voltage changes on input terminal 15 to control terminal 12. Second, source follower 53 protects signals on input terminal 15 from becoming distorted by current supplied by current source 62. Isolating AC signals on input terminal 15 from current source 62 preserves the signal integrity and quality of signals on input terminal 15 of switch 10.

Figure 6B:
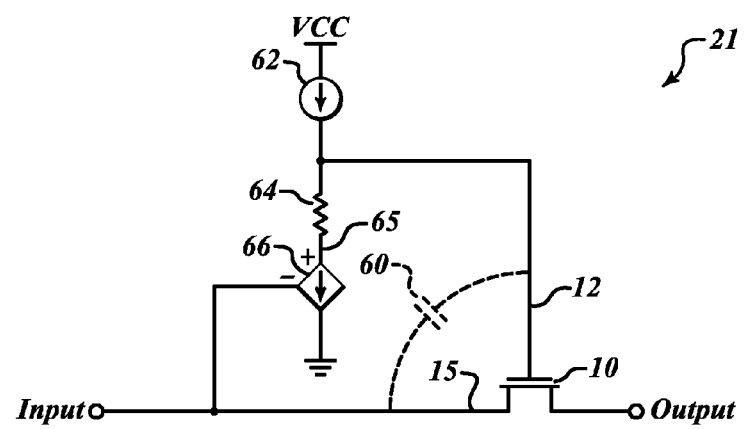

FIG. 6B illustrates a simplified model 21 of analog switch configuration 19 while control signal SW_CTL is driven low. Simplified model 21 includes switch 10, current source 62, resistor 64 which represents the combined resistance of resistor 63 and the channel resistance of transistor 61, and voltage-controlled current source 66. Also represented in simplified model 21 is the control terminal to input terminal capacitance of switch 10, capacitance 60. In one embodiment, the peak to peak swings on input terminal 15 are kept low enough that transistor 50 is always in an on state. Simplified model 21 shows current source 62 and current source 66 sourcing and sinking current through resistor 64. Because the voltage controlled current source 66 sinks a current fixed by current source 62, the voltage drop from node 65 to input terminal 15 becomes fixed as well. Increases and decreases in voltage potential at input terminal 15 are therefore duplicated at node 65. Voltage potential changes at node 65 are then duplicated at control terminal 12 by virtue of the constant voltage drop established across resistor 64.

The following exemplary values illustrate how the circuit of simplified model 21 reduces a parasitic capacitance current to mitigate the effect of capacitance 60. Assume current source 62 is supplying 30 mA of current and resistor 64 is 105 ohms. Also, assume that a 30 mA current through current source 66 establishes a 0.5 V drop from node 65 to input terminal 15. In this illustrative configuration, the voltage potential at control terminal 12 would become 3.65 V when the voltage potential at input terminal 15 is 0V. An increase or decrease in voltage potential at input terminal 15 would be nearly linearly reflected at control terminal 12. Referring back to the current through capacitance 60 being governed by $$i_C = C \frac{dv}{dt},$$

simplified model 21 shows that analog switch configuration 19 reduces the capacitive current $i_C$ to nearly zero by decreasing the change in voltage across capacitance 60 with respect to time to nearly 0 V. Thus, preserving the voltage drop between control terminal 12 and input terminal 15 enables switch configuration 19 to pass rapidly transitioning signals from input terminal 15 to the output terminal.

High frequency applications use analog switches capable of maintaining small signal quality and integrity through a wide bandwidth of frequencies. The present disclosure undermines the affect of the capacitance 60 of simplified model 21. The effect of capacitance 60 is mitigated by fixing the voltage drop across the control and input terminals. Because this voltage is maintained, AC signal current is able to flow through the channel of switch 10. Hence, the present disclosure increases the frequency by which AC signals may be introduced on the input of switch 10 to be passed to the output of switch 10.

In one embodiment, the switch of the present disclosure is incorporated in a high-speed application such as universal serial bus ("USB"). In another embodiment, the switch of the present disclosure is incorporated into the construction of local area network ("LAN") hardware. In another embodiment, a switch configuration of the present disclosure in incorporated in a DisplayPort application, or the like.

In one embodiment the present disclosure is applied to a high definition media interface ("HDMI") application. HDMI is a common interface in televisions and video-playing devices and offers high resolution at fast speeds. In one embodiment, the analog switch configuration of the present disclosure is used on a receiving end of an HDMI interface to route signals from a port to a buffer. In another embodiment, the analog switch configuration of the present disclosure is used on a transmitting end of an HDMI interface after an output buffer to select one of many available ports to transmit signal data.

In one embodiment the present disclosure is applied to low voltage differential signaling ("LVDS") applications. LVDS systems are commonly used in computer systems to transmit data using a differential pair of wires terminated in a resistor. An analog switch, such as the one presently disclosed, may be used on the transmission end of an LVDS system to facilitate high speed transfers of data.

Another application of the present disclosure includes low-flatness switch usage. Switch flatness is defined as the difference between maximum and minimum on-resistance for the defined signal range. In order to achieve low flatness, NMOS/PMOS complementary switches are used to compensate each other. If voltage difference between the control and input terminals, i.e. gate and source, of either NMOS or PMOS is kept constant, the on-resistance would vary very little. Thus, the present disclosure may also be applied to low-flatness switch applications.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

I claim:

1. A semiconductor circuit, comprising:
    a switch including an input terminal, an output terminal, and a control terminal;
    a first transistor having an output terminal coupled to the control terminal of the switch;
    a second transistor having an output terminal coupled to the control terminal of the switch; and
    a third transistor having a first terminal and a second terminal, the first terminal of the third transistor being coupled to the input terminal of the switch and the second terminal of the third transistor being coupled to the control terminal of the switch; and
    a resistor coupled to the third transistor between the control terminal of the switch and the input of the switch, the coupling configured to pass a change in a voltage potential on the input terminal of the switch from the input terminal of the switch to the control terminal of the switch.

2. A semiconductor circuit, comprising:
    a switch including an input terminal, an output terminal, and a control terminal;
    a first transistor having an output terminal coupled to the control terminal of the switch;
    a second transistor having an output terminal coupled to the control terminal of the switch; and
    a third transistor having a first terminal and a second terminal, the first terminal of the third transistor being coupled to the input terminal of the switch and the second terminal of the third transistor being coupled to the control terminal of the switch, the coupling configured to pass a change in a voltage potential on the input terminal of the switch from the input terminal of the switch to the control terminal of the switch, wherein the first terminal of the third transistor is a gate terminal and the second terminal of the third transistor is a source terminal.

3. The semiconductor circuit of claim 2 wherein the second terminal of the third transistor is coupled to a first terminal of a resistor and a second terminal of the resistor is coupled to the control terminal of the switch.

4. The semiconductor circuit of claim 3 wherein a third terminal of the third transistor is a drain terminal, said third terminal being connected to ground.

5. A semiconductor circuit, comprising:
    a switch including an input terminal, an output terminal, and a control terminal;
    a first transistor having an output terminal coupled to the control terminal of the switch;
    a second transistor having an output terminal coupled to the control terminal of the switch; and
    a third transistor having a first terminal and a second terminal, the first terminal of the third transistor being coupled to the input terminal of the switch and the second terminal of the third transistor being coupled to the control terminal of the switch, the coupling configured to pass a change in a voltage potential on the input terminal of the switch from the input terminal of the switch to the control terminal of the switch, wherein the first terminal of the third transistor is a drain terminal and the second terminal of the third transistor is a source terminal.

6. The semiconductor circuit of claim 5 wherein the first terminal of the third transistor is coupled to a first terminal of a resistor and a second terminal of the resistor is coupled to the input terminal of the switch.

7. The semiconductor circuit of claim 6 wherein a third terminal of the third transistor is configured to enable and disable the third transistor.

8. The semiconductor circuit of claim 7 wherein the first transistor is configured to operate as a current source.

9. A semiconductor circuit, comprising:
    a switch including an input terminal, an output terminal, and a gate terminal; and
    a gate control circuit coupled to the gate terminal of the switch, comprising:
        a first control transistor having an output terminal coupled to the gate terminal of the switch;
        a second control transistor having a gate terminal and an output terminal, the output terminal of the second control transistor being coupled to the gate terminal of the switch, the gate terminal of the second control transistor configured to receive a control signal for the switch; and
        a means for transferring at least part of a change in voltage potential on the input of the switch to the gate terminal of the switch, wherein said means includes a third control transistor and resistor coupled between the input terminal of the switch and the gate terminal of the switch.

10. The semiconductor circuit of claim 9 wherein the first control transistor is configured to supply a substantially fixed current.

11. The semiconductor circuit of claim 9 wherein the means for transferring maintains a substantially fixed voltage drop across it.

12. The semiconductor circuit of claim 9 wherein the first control transistor is configured as a current source.

13. A method of operating an analog switch, comprising:
    receiving a voltage signal on an input of the switch;
    receiving a control signal at a first transistor to enable or disable the switch;
    biasing a control terminal of the switch with a second transistor coupled between the control terminal of the switch and a voltage supply; and
    transferring at least part of any change in the voltage signal at the input of the switch from the input of the switch to the control terminal of the switch to decrease the affect of an inherent capacitance between the input and the control terminal of the switch, wherein transferring is performed by enabling a third transistor coupled to a resistor to conduct current between the control terminal and the input of the switch.

14. The method of claim 13 wherein transferring includes supplying a substantially constant current through the third transistor and preventing the input of the switch from receiving the supplied current.

* * * * *